United States Patent [19]

Ukai et al.

[11] Patent Number: 4,849,797

[45] Date of Patent: Jul. 18, 1989

[54] THIN FILM TRANSISTOR

[75] Inventors: Yasuhiro Ukai, Kobe; Shigeo Aoki, Habikino, both of Japan

[73] Assignee: Hosiden Electronics Co., Ltd., Osaka, Japan

[21] Appl. No.: 145,949

[22] Filed: Jan. 20, 1988

[30] Foreign Application Priority Data

Jan. 23, 1987 [JP] Japan .................................. 62-13786
Mar. 6, 1987 [JP] Japan .................................. 62-52417
Mar. 6, 1987 [JP] Japan .................................. 62-52418

[51] Int. Cl.$^4$ ............................................. H01L 29/78
[52] U.S. Cl. .......................................... 357/237; 357/4; 357/2; 357/61
[58] Field of Search ..................... 357/4, 23.7, 2, 61, 357/23.15

[56] References Cited

U.S. PATENT DOCUMENTS 3,600,218  8/1971  Pennibaker ................. 357/23.15 X
4,642,144  2/1987  Tiedje ................................ 357/4 X Primary Examiner—Martin H. Edlow
Attorney, Agent, or Firm—Pollock, Vande Sande and Priddy

[57] ABSTRACT

In a thin film transistor which has an active layer formed between source and drain electrodes, a gate insulating film formed in contact with the active layer, and a gate electrode formed in contact with the gate insulating film, the photoconductivity of the active layer is reduced by forming the active layer of amorphous silicon carbide (a-Si$_{1-x}$C$_x$) whose carbon content x is greater than 0.1.

19 Claims, 4 Drawing Sheets

THIN FILM TRANSISTOR

BACKGROUND OF THE INVENTION

The present invention relates to a thin film transistor which is used as a switching element for a display electrode in an active type liquid crystal display element, for example.

A conventional thin film transistor of this kind utilizes hydrogenated amorphous silicon for its active layer. Since the amorphous silicon is photoconductive, incidence of light to the active layer of the thin film transistor impairs the ON-OFF ratio of the transistor. To avoid this, it is customary in the prior art to provide a light shielding layer.

As shown in FIG. 1, a light shielding layer 12 of chromium, for instance, is formed on a transparent insulating substrate 11 of glass or similar material, an insulating layer 13 of $SiO_2$, for example, is formed over the light shielding layer 12, and source and drain electrodes 14 and 15 are formed by transparent conductive films on the insulating layer 13, with their inner marginal portions overlying the opposite marginal portions of the light shielding layer 12 across the insulating layer 13. An active layer 16 of hydrogenated amorphous silicon is formed over the insulating layer 13 between the source and drain electrodes 14 and 15. A gate insulating film 17 as of $SiN_x$ or $SiO_2$ is formed over the active layer 16, and a gate electrode 18 of aluminum, for instance, is formed on a gate insulating film 17. Ohmic contact layers 21 and 22 are formed between the source and drain electrodes 14 and 15 and the active layer 16, respectively.

Light incident to the thin film transistor from the outside of the substrate 11 is shielded or prevented by the light shielding layer 12 from reaching the active layer 16 so as to avoid the bad influence by its photoconductivity. Conventionally, the use of such a light shielding layer 12 necessitates the formation of the insulating layer 13 for electrically insulating layer 12 from the source and drain electrodes 14 and 15, resulting in the number of steps involved in the manufacture of the thin film transistor becoming large and its structure becoming complex.

Furthermore, since hydrogenated amorphous silicon is used for the active layer 16, the electric field mobility is low, and accordingly the current driving power is small. Therefore, when the thin film transistor is employed as a switching element for the display electrode of an active type liquid crystal display element, for instance, its operating speed is comparatively low, and it is difficult to implement a peripheral drive circuit of the active liquid crystal display element through use of the thin film transistor.

Moreover, since the prior art employs different materials for the active layer 16 and the gate insulating film 17, they have different coefficients of thermal expansion and the surface energy level is so large that no excellent thin film transistor can be obtained.

SUMMARY OF THE INVENTION

It is therefore an object of the present invention to provide a thin film transistor which is free from the above-mentioned defects of the prior art.

According to the present invention, the active layer of the thin film transistor is formed of amorphous silicon carbide (a-$Si_{1-x}C_x$) and the carbon content x is selected larger than 0.1.

An increase in the carbon content in the amorphous silicon carbide increases its optical energy gap; when x $>0.1$, the optical energy gap amounts to 2.0 to 4 eV or so. On the other hand, the optical energy gaps of conventional amorphous silicon and hydrogenated amorphous silicon containing 30 atomic % H are only 1.6 and 1.9 eV, respectively. Accordingly, the optical energy gap of the amorphous silicon carbide for use in the present invention is comparatively large, and no light shielding layer is needed. In addition, since amorphous silicon carbide with practically no photoconductivity can also be obtained through control of the electric conductivity of the amorphous silicon carbide, a-$Si_{1-x}C_x$, by doping it with boron (B) or phosphorus (P), no light shielding layer is needed. This permits simplification of the structure of the thin film transistor and makes it easier to manufacture.

According to another aspect of the present invention, the active layer may preferably have a heterojunction superlattice structure. That is, the active layer is formed by laminating many well layers of hydrogenated amorphous silicon carbide, a-$Si_{1-x}C_x$:H (where x $<0.5$), and many barrier layers of hydrogenated amorphous silicon carbide, a-$Si_{1-x}C_x$:H (where x $>0.5$), alternately with each other, or by laminating many well layers of hydrogenated amorphous silicon, a-Si:H, and barrier layers of hydrogenated amorphous silicon carbide, a-$Si_{1-x}C_x$:H, alternately with each other.

Since the active layer has such a heterojunction superlattice structure, the mobility of quasi two-dimensional carriers is increased by the quantum effect, yielding a large current driving force.

Moreover, the active layer is formed of the amorphous silicon carbide a-$Si_{1-x}C_x$ as mentioned above and the gate insulating film is also formed of the same amorphous silicon carbide but the carbon content x thereof is selected larger than that of the active layer. Thus the active layer and the gate insulating film are made of the same material, and hence they are equal in the coefficient of thermal expansion so that a high-performance thin film transistor can be obtained.

DESCRIPTION OF THE PREFERRED EMBODIMENTS

Figure 1:
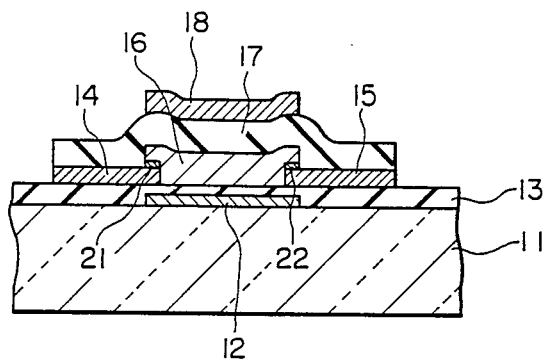
FIG. 1 is a sectional view showing a conventional thin film transistor.
Figure 2:
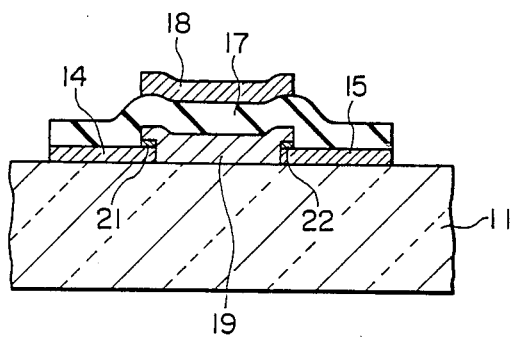
FIG. 2 is a sectional view illustrating an embodiment of the present invention.

FIG. 2 illustrates an embodiment of the thin film transistor of the present invention, in which the parts corresponding to those in FIG. 1 are identified by the same reference numerals. In the present invention no light shielding layer is provided, and accordingly no insulating layer is also needed for insulating the light shielding layer and the electrodes. In this example the source and drain electrodes 14 and 15 are deposited directly on the substrate 11.

Moreover, according to the present invention, the active layer 19 which is interposed between the source and drain electrodes 14 and 15 is formed of amorphous silicon carbide a-Si$_{1-x}$C$_x$ with the carbon content x ranging from 0.1 to 0.95, or amorphous silicon carbide (where the carbon content x is larger than 0.1) doped with a group III element such as boron (B) or a group V element such as phosphorus (P). The gate insulating film 17 and the gate electrode 18 are deposited one after the other on the active layer 19 in the same manner as in the past.

Figure 3:
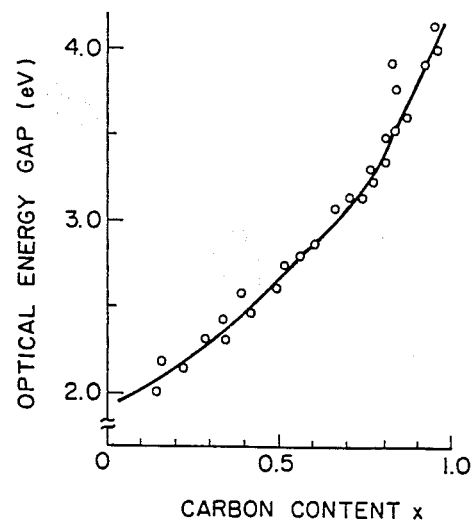
FIG. 3 is a graph showing the relationship between the optical energy gap of amorphous silicon carbide and the carbon content x thereof.

With such a structure, since the optical energy gap of the active layer 19 is large, the thin film transistor is almost free from the influence of light incident on the active layer 19 even if no light shielding layer is provided. FIG. 3 shows, by way of example, variations in the optical energy gap of the amorphous silicon carbide a-Si$_{1-x}$C$_x$ with the carbon content x thereof when the amorphous silicon carbide was deposited directly on the substrate at room temperature. As seen from FIG. 3, the optical energy gap is around 2.8 eV when the carbon content x is 0.5 and the optical energy gap becomes as large as about 4.0 eV when the carbon content x is further increased. Accordingly, the thin film transistor of the present invention will be substantially insusceptible to the influence of external light.

Figure 4:
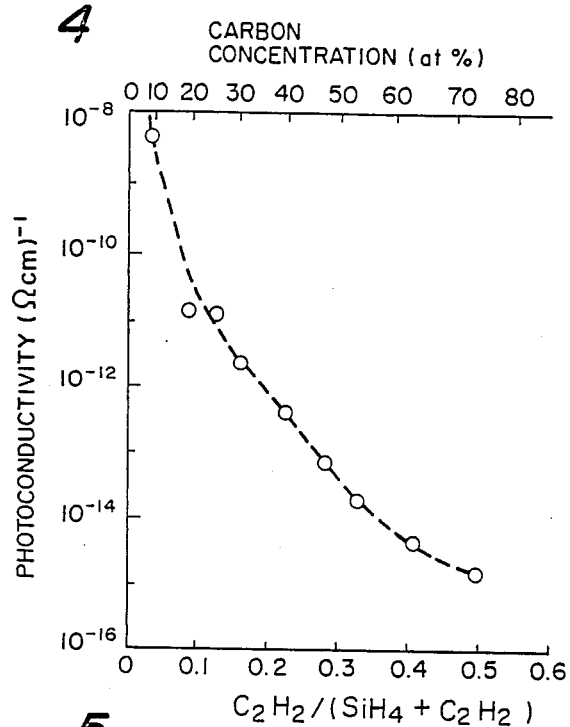
FIG. 4 is a graph showing the relationship between the photoconductivity of the amorphous silicon carbide and the carbon content x thereof.

The amorphous silicon carbide can be formed using silane (SiH$_4$) and acetylene (C$_2$H$_2$) through a plasma-assisted CVD (Chemical Vapor Deposition) process. In this case, the carbon content can be controlled by a suitable selection of the ratio between the flow rates of the silane and acetylene, as shown in FIG. 4. The carbon content increases with an increase in flow rate of the acetylene relative to the flow rate of the silane. Further, FIG. 4 shows the relationship between the photoconductivity of the amorphous silicon carbide and the carbon content therein, from which it will be understood that an increase in the carbon content decreases the photoconductivity, that is, lessens the influence of the incidence of external light.

Figure 5:
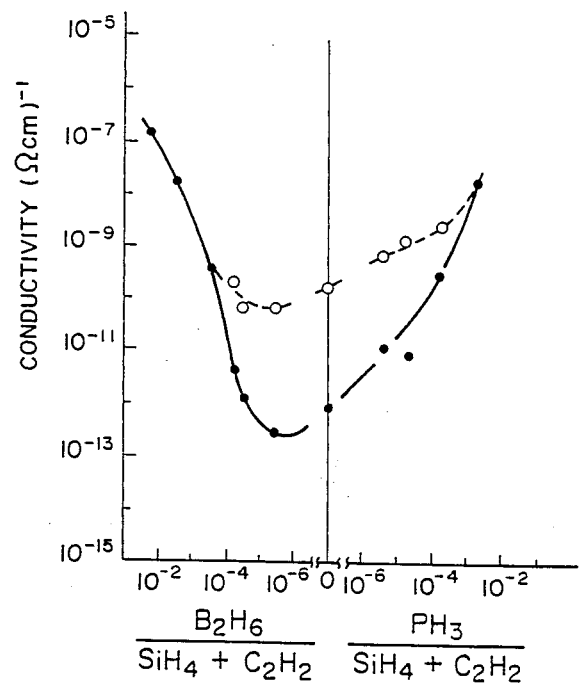
FIG. 5 is a graph showing the relationships between the photoconductivity and dark conductivity of the amorphous silicon carbide and the dose of phosphorus (P) or boron (B) with which it is doped.

FIG. 5 shows variations in the dark conductivity and photoconductivity of the amorphous silicon carbide a-Si$_{1-x}$C$_x$ doped with phosphorus (P) or boron (B) for valence electron control. The photoconductivity was measured by irradiation with light of a wavelength 612.8 mm and a power 100 $\mu$W/cm$^2$. In the case of doping the amorphous silicon carbide with phosphorus or boron, phosphine (PH$_3$) or diborane (B$_2$H$_6$) is used, respectively. High-frequency power for generating a plasma was 150 W, the gas pressure was 0.45 Torr, the substrate temperature was 300° C., and the flow rates of gases SiH$_4$, C$_2$H$_2$ and H$_2$ were 100, 10 and 300 sccm (sccm stands for standard cubic centimeter per minute), respectively. With a ratio, PH$_3$/(Si$_4$ +C$_2$H$_2$) or B$_2$H$_6$/(SiH$_4$ +C$_2$H$_2$), in the range of between 10$^{-3}$ and 10$^{-2}$, the dark conductivity (indicated by black circles) and photoconductivity (indicated by white circles) of the amorphous silicon carbide a-Si$_{1-x}$C$_x$ are in agreement with each other, rendering it insusceptible to the influence of external light.

As described above, according to the present invention, the active layer is formed of amorphous silicon carbide a-Si$_{1-x}$C$_x$ with the carbon content x selected greater than 0.1, or similar amorphous silicon carbide doped with a group III element such as boron (B) or a group V such as phosphorus (P) so as to make the active layer insusceptible to external light. Accordingly, the thin film transistor of the present invention calls for neither of the formation of the light shielding layer or the insulation between the light shielding layer and the electrodes, and hence it is simple in structure and easy to manufacture.

Figure 6:
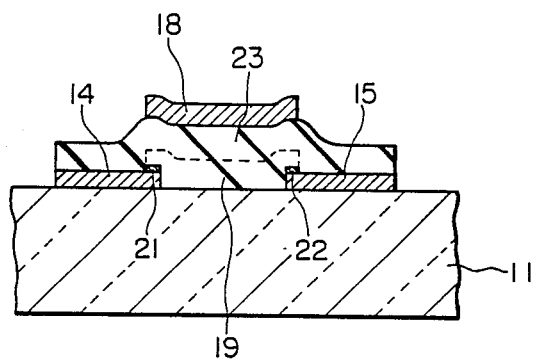
FIG. 6 is a sectional view illustrating another embodiment of the present invention.

FIG. 6 illustrates another embodiment of the thin film transistor of the present invention, in which the parts corresponding to those in FIG. 2 are identified by the same reference numerals. In this embodiment the active layer 19, which is interposed between the source and drain electrodes 14 and 15, is formed of amorphous silicon carbide a-Si$_{1-x}$C$_x$ whose carbon content x is selected less than 0.2, yielding an electric conductivity in the range of, for instance, between 10$^{-9}$ and 10$^{-12}$ ($\Omega$cm)$^{-1}$.

Figure 7:
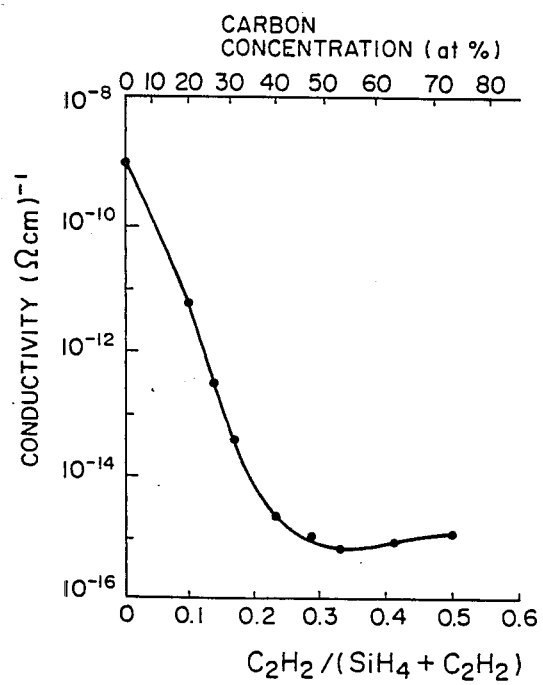
FIG. 7 is a graph showing the relationship between the conductivity of the amorphous silicon carbide and the carbon content x thereof.

A gate insulating film 23, which is deposited in contact with the active layer 19, is also formed of amorphous silicon carbide a-Si$_{1-x'}$C$_{x'}$. The carbon content x' of insulating film 23 is selected larger than the carbon content x in the active layer 19, for example, in the range of 0.2 <x <0.95, setting its electric conductivity to 10$^{-16}$ ($\Omega$cm)$^{-1}$, for instance. The active layer 19 and the gate insulating film 23 of such amorphous silicon carbide can be formed using silane (SiH$_4$) and acetylene (C$_2$H$_2$) through the plasma-assisted CVD process, and in this case, the ratio between their flow rates needs only to be controlled. That is, in the case of forming the gate insulating film 23, the flow rate of the silane is controlled to be lower than in the case of forming the active layer 19. The electric conductivity of the thus formed amorphous silicon carbide, relative to the ratio between the flow rates of the acetylene (C$_2$H$_2$) and a gas mixture (SiH$_4$+C$_2$H$_2$), varies about 10$^{-9}$ to 10$^{-16}$ ($\Omega$cm)$^{-1}$, by controlling the conditions for forming the film, as shown in FIG. 7. Accordingly, the active layer 19 and the gate insulating film 23 can be provided in succession by, for example, controlling the ratio between the flow rates of the silane and acetylene after the formation of the active layer 19. The carbon concentration of the active layer 19 is selected to be about 10%, for instance, whereas the carbon concentration of the gate insulating film 23 is selected to be around 50%.

In this embodiment, since the active layer 19 and the gate insulating film 23 are formed of the same material, their coefficients of thermal expansions are virtually equal to each other, ensuring the provision of a high-performance thin film transistor. Moreover, they can be obtained simply by controlling the ratio between the flow rates of the two gases in the same gas system, as mentioned above; therefore, the thin film transistor of the present invention is easy to fabricate and excellent in the interface characteristic between the active layer and the gate insulating film.

Figure 8:
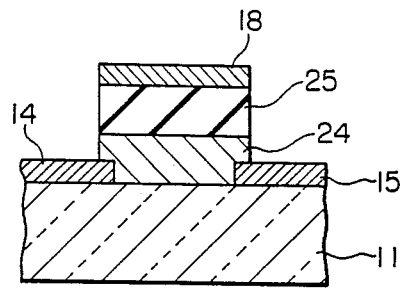
FIG. 8 is a sectional view illustrating another embodiment of the present invention.

FIG. 8 illustrates another embodiment of the thin film transistor of the present invention applied to a top gate type stagger structure, in which the parts corresponding to those in FIG. 2 are identified by the same reference numerals.

In this embodiment, an active layer 24 is formed by an alternate lamination of well layers of hydrogenated amorphous silicon carbide a-$Si_{1-x}C_x$:H (where $x < 0.5$) and barrier layers of hydrogenated amorphous silicon carbide a-$Si_{1-x}C_x$:H (where $x > 0.5$). The well layers are each 25 Å thick, for instance, and the barrier layers each 50 Å thick, for example. Fifteen pairs of such layers are deposited to form the active layer 24 to a thickness of a total of 1125 Å.

The active layer 24 can be obtained by a glow discharge in gas mixture of silane ($SiH_4$) and acetylene ($C_2H_2$). In this instance, it is possible to employ a method in which upon each formation of one of the well and barrier layers, the discharge is stopped and a raw material gas is exchanged with another for the formation of the next layer, or a method in which the discharge is not stopped but only the raw material gas is exchanged as required.

In the embodiment shown in FIG. 8, a gate insulating film 25 is formed of amorphous silicon carbide a-$Si_{1-x}C_x$ (where $x > 0.5$). In this case, the formation of the active layer 24 can be followed by the formation of the gate insulating film 25.

With the carbon content x of the amorphous silicon carbide a-$Si_{1-x}C_x$ selected more than 0.5, the electric conductivity of the film appreciably lowers, as depicted in FIG. 7, and it can be used as an insulating film.

Figure 9:
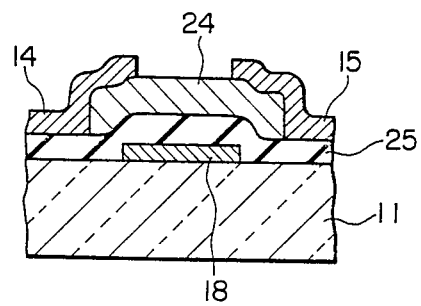
FIG. 9 is a sectional view illustrating an example in which the present invention is applied to a bottom gate type stagger structure.

FIG. 9 illustrates another embodiment of the thin film transistor of the present invention applied to a bottom gate type stagger structure. The gate electrode 18 is formed directly on the substrate 11, which is covered with the gate insulating film 25, which is, in turn, covered with the active layer 24, and the source and drain electrodes 14 and 15 are deposited at opposite sides of the active layer 24.

Figure 10:
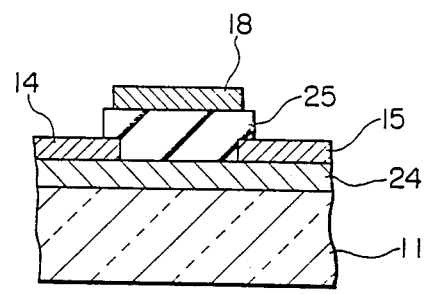
FIG. 10 is a sectional view illustrating an example in which the present invention is applied to a coplanar structure.

FIG. 10 illustrates another embodiment of the thin film transistor of the present invention applied to a coplanar structure. The active layer 24 is deposited directly on the substrate 11, the source and drain electrodes 14 and 15 are disposed apart on the active layer 24, the gate insulating film 25 is formed between the source and drain electrodes 14 and 15, and the gate electrode 18 is deposited on the gate insulating film 25.

In the above embodiments of the invention the well and barrier layers of the active layer 24 are both formed of hydrogenated amorphous silicon carbide a-$Si_{1-x}C_x$:H, but according to still another embodiment of the present invention, the well layers are formed of hydrogenated amorphous silicon a-Si:H and the barrier layers are formed of hydrogenated amorphous silicon carbide a-$Si_{1-x}C_x$:H. Also in this instance, the well layers are each 25 Å thick and the barrier layers are each 50 Å thick, and fifteen pairs of such layers are laminated to form the active layer 24 to a thickness of 1125 Å as a whole. This active layer can be provided by the glow discharge method in a gas mixture of, for instance, silane ($SiH_4$) and acetylene ($C_2H_2$) as described previously.

In the embodiments described above with respect to FIG. 8 and 10, since the active layer has a heterojunction superlattice structure, the mobility of quasi two-dimensional carriers is increased by the quantum efficiency, yielding a large current driving force.

Accordingly, when applied as a switching element for a display electrode of an active liquid crystal display element, for example, the thin film transistor of the present invention permits quick charging and discharging of the display electrode. Furthermore, this thin film transistor has the capability of driving a large current and can fully be utilized as an active element of a peripheral drive circuit of the active liquid crystal display element as well. Therefore, the switching element for a display electrode of the liquid crystal display element and its peripheral drive circuit can be formed concurrently on the same substrate, by the thin film transistors of the present invention.

The photoconductivity of the hydrogenated amorphous silicon carbide a-$Si_{1-x}C_x$:H decreases with an increase in the carbon content x, as depicted in FIG. 4, and the optical energy gap increases with an increase in the carbon content x, as shown in FIG. 3 In other words, the photoconductive effect of the hydrogenated amorphous silicon carbide diminishes with an increase in the carbon content x. In view of this, the carbon content x of the barrier layer is selected to be greater than 0.5, so that a high-performance thin film transistor can be obtained which will not be affected by the incidence of external light to the active layer 24 through the substrate 11.

It will be apparent that many modifications and variations may be affected without departing from the scope of the novel concepts of the present invention.

What is claimed is:

1. A thin film transistor which has an active layer formed between source and drain electrodes, a gate insulating film formed in contact with the active layer, and a gate electrode formed in contact with the gate insulating film, the improvement wherein said active layer is formed of amorphous silicon carbide (a-$Si_{1-x}C_x$) and the carbon content x of said amorphous silicon carbide is greater than 0.1 to reduce the photoconductivity of said active layer.

2. The thin film transistor of claim 1, wherein the carbon content x of the amorphous silicon carbide in said active layer is less than 0.95.

3. The thin film transistor of claim 2, wherein the amorphous silicon carbide in said active layer is doped with an element of group III.

4. The thin film transistor of claim 3, wherein the group III element is boron (B).

5. The thin film transistor of claim 2, wherein the amorphous silicon carbide in said active layer is doped with an element of group V.

6. The thin film transistor of claim 5, wherein the group V element is phosphorus (P).

7. The thin film transistor of claim 1, wherein the gate insulating film is formed of amorphous silicon carbide the carbon content x of which is greater than that of the amorphous silicon carbide forming the active layer.

8. The thin film transistor of claim 7, wherein the carbon content of the amorphous silicon carbide forming the active layer is less than 0.2 and the carbon content x of the amorphous silicon forming the gate insulating film is in the range of $0.2 < x < 0.95$.

9. The thin film transistor of claim 8 wherein the carbon content x of the amorphous silicon carbide in said active layer is about 0.1 and the carbon content x of the amorphous silicon carbide in said gate insulating film is about 0.5.

10. The thin film transistor of claim 8, wherein the amorphous silicon carbide in said active layer is doped with boron (B).

11. The thin film transistor of claim 8, wherein the amorphous silicon carbide in said active layer is doped with phosphorus (P).

12. The thin film transistor of claim 1, wherein the active layer of said amorphous silicon carbide is formed by an alternate lamination of well layers made of hydrogenated amorphous silicon (A-Si:H) and barrier layers made of hydrogenated amorphous silicon carbide (a-$Si_{1-x}C_x$:H).

13. The thin film transistor of claim 12, wherein the well layers are each about 25 Å thick and the barrier layers are each about 50 Å thick.

14. The thin film transistor of claim 13, wherein the cycle of lamination of the well barrier layers is 15.

15. The thin film transistor of claim 12, wherein the gate insulating film is formed of amorphous silicon carbide, the carbon content x of which is greater than that of the active layer.

16. The thin film transistor of claim 1 wherein said active layer of amorphous silicon carbide is comprised of alternate laminations of well layers made of hydrogenated amorphous silicon carbide whose carbon content x is smaller than 0.5 and barrier layers made of hydrogenated amorphous silicon carbide whose carbon content x is greater than 0.5.

17. The thin film transistor of claim 16, wherein the well layers are each about 25 Å thick and the barrier layers are each about 50 Å thick.

18. The thin film transistor of claim 17, wherein the cycle of lamination of the well and barrier layers is 15.

19. The thin film transistor of claim 16, wherein the gate insulating film is formed of amorphous silicon carbide, the carbon content x of which is greater than that of the active layer.

* * * * *